United States Patent
Futakuchi et al.

(10) Patent No.: US 9,625,496 B2
(45) Date of Patent: Apr. 18, 2017

(54) MAGNETIC SENSOR

(71) Applicant: Hitachi Metals, Ltd., Tokyo (JP)

(72) Inventors: Naoki Futakuchi, Hitachinaka (JP); Yukio Ikeda, Hitachi (JP); Kazuhisa Takahashi, Hitachi (JP)

(73) Assignee: HITACHI METALS, LTD., Tokyo (JP)

( * ) Notice: Subject to any disclaimer, the term of this patent is extended or adjusted under 35 U.S.C. 154(b) by 68 days.

(21) Appl. No.: 14/682,635

(22) Filed: Apr. 9, 2015

(65) Prior Publication Data

US 2015/0316637 A1 Nov. 5, 2015

(30) Foreign Application Priority Data

May 1, 2014 (JP) ................................. 2014-094629

(51) Int. Cl.
- *G01R 15/20* (2006.01)
- *G01R 35/00* (2006.01)
- *G01R 33/00* (2006.01)
- *G01R 33/09* (2006.01)

(52) U.S. Cl.
CPC ....... *G01R 15/205* (2013.01); *G01R 33/0029* (2013.01); *G01R 35/00* (2013.01); *G01R 33/093* (2013.01); *G01R 33/096* (2013.01)

(58) Field of Classification Search
CPC .. G01R 33/0029; G01R 15/205; G01R 35/00; G01R 33/093; G01R 33/096
USPC ....................................................... 324/248
See application file for complete search history.

(56) References Cited

U.S. PATENT DOCUMENTS

| | | | | |
|---|---|---|---|---|
| 2,101,780 A * | 12/1937 | Kinsley | ................ | G01R 33/123 324/222 |
| 4,953,590 A * | 9/1990 | Kakinuma | .............. | F02D 41/20 137/554 |
| 6,703,827 B1 * | 3/2004 | Wolf | ...................... | G01D 3/022 324/207.12 |
| 6,969,988 B2 * | 11/2005 | Kakuta | .................... | G01D 5/14 324/207.2 |
| 7,132,824 B2 * | 11/2006 | Masuda | ................. | G01D 5/145 324/207.12 |
| 7,233,139 B2 * | 6/2007 | Kitanaka | ................ | G01D 5/145 324/207.12 |
| 7,764,033 B2 * | 7/2010 | Yasuda | ..................... | H02P 6/16 318/400.38 |
| 7,872,439 B2 * | 1/2011 | Yasuda | ..................... | H02P 6/16 318/400.39 |
| 2001/0043155 A1* | 11/2001 | Kato | ....................... | G01C 17/28 342/1 |

(Continued)

FOREIGN PATENT DOCUMENTS

JP 2000-055997 2/2000

*Primary Examiner* — Jermele M Hollington
*Assistant Examiner* — Christopher McAndrew
(74) *Attorney, Agent, or Firm* — Roberts Mlotkowski Safran Cole & Calderon P.C.

(57) ABSTRACT

A magnetic sensor includes a magnetic detection element, and a correcting section to correct an output voltage of the magnetic detection element and output the corrected output voltage. The correcting section is configured to compute a magnetic flux density from the output voltage of the magnetic detection element, compute and output the corrected output voltage having a linear relationship to the computed magnetic flux density.

10 Claims, 1 Drawing Sheet

(56) References Cited

U.S. PATENT DOCUMENTS

| | | | |
|---|---|---|---|
| 2004/0056652 A1* | 3/2004 | Bomya | B60R 21/0136 324/207.17 |
| 2005/0258825 A1* | 11/2005 | Masuda | G01D 5/145 324/207.26 |
| 2005/0275399 A1* | 12/2005 | Kitanaka | G01D 5/145 324/207.12 |
| 2007/0091668 A1* | 4/2007 | Ho | G11C 11/15 365/158 |
| 2007/0188168 A1* | 8/2007 | Stanley | B60R 21/0136 324/228 |
| 2008/0203961 A1* | 8/2008 | Yasuda | H02P 6/16 318/647 |
| 2009/0009118 A1* | 1/2009 | Takeuchi | H02P 6/16 318/400.38 |
| 2009/0121704 A1* | 5/2009 | Shibahara | G01R 15/202 324/117 R |
| 2010/0253253 A1* | 10/2010 | Yasuda | H02P 6/16 318/400.04 |
| 2013/0272563 A1* | 10/2013 | Boyd | H04R 1/00 381/406 |

* cited by examiner

MAGNETIC SENSOR

The present application is based on Japanese patent application No. 2014-094629 filed on May 1, 2014, the entire contents of which are incorporated herein by reference.

BACKGROUND OF THE INVENTION

1. Field of the Invention

This invention relates to a magnetic sensor.

2. Description of the Related Art

An electric current detecting structure using a magnetic sensor is widely known.

The magnetic sensor is configured to output a magnetic flux density dependent voltage, and the magnetic sensor is therefore arranged in proximity to an electric current path in which an electric current to be detected flows, so that it is possible to compute from the output voltage of that magnetic sensor a magnetic flux density (magnetic flux density at the location of the arrangement of that magnetic sensor) produced by the electric current to be detected, and compute from the computed magnetic flux density a value of the electric current to be detected.

As known magnetic detection elements used in that magnetic sensor, there are a Hall element, an anisotropic magnetoresistance element (hereinafter referred to as "AMR element"), a giant magnetoresistance element (hereinafter referred to as "GMR element"), etc.

As prior art information in connection herewith, there is the following patent document.

Refer to e.g. JP-A-2000-55997.

SUMMARY OF THE INVENTION

However, the AMR element and the GMR element have a nonlinear relationship between the magnetic flux density to be detected and the output voltage, causing a narrow range in which the relationship between the magnetic flux density and the output voltage is linear, i.e. the relationship between the magnetic flux density and the output voltage can be approximated by a linear relationship.

Since the magnetic flux density and the electric current value are proportional to each other, when the electric current is detected by using the conventional magnetic sensor, the range in which the relationship between the electric current value to be detected and the output voltage is linear is narrow, causing a narrow range of detectable electric current values.

Also, due to a narrow range of available magnetic flux densities, the degree of freedom of arrangement of the magnetic detection element lowers.

Conventionally, widening the range in which the linear relationship between the magnetic flux density (or the electric current value to be detected) and the output voltage is available has required the adoption of a complicated measuring method such as a magnetic balance system or the like.

Accordingly, it is an object of the present invention to provide a magnetic sensor, which obviates the above drawback so as to be able to widen the range in which the linear relationship between the magnetic flux density and the output voltage is available.

According to an embodiment of the invention, a magnetic sensor comprises:

a magnetic detection element; and
a correcting section to correct an output voltage of the magnetic detection element and output the corrected output voltage,
wherein the correcting section is configured to compute a magnetic flux density from the output voltage of the magnetic detection element, compute and output the corrected output voltage having a linear relationship to the computed magnetic flux density.

In the embodiment, the following modifications and changes may be made.

(i) The correcting section is configured to output a corrected output voltage $V_{out}$, by, when a relationship between a magnetic flux density B and an output voltage V at the magnetic detection element is expressed by equation (1) below, computing the corrected output voltage $V_{out}$ from equation (2) below.

$$V = f(B) \tag{1}$$

$$V_{out} = m \cdot B = m \cdot f^{-1}(V) \tag{2}$$

where m is a coefficient, and $f^{-1}(V)$ is the inverse function of $f(B)$.

(ii) The magnetic detection element is an anisotropic magnetoresistance element.

(iii) Equation (3) or (4) below is used as the relationship between the magnetic flux density B and the output voltage V at the magnetic detection element.

$$V = f(B) = a\{\cos(bB+c)\}^2 + d \tag{3}$$

where a, b, c, and d are coefficients.

$$V = f(B) = a\{\sin(bB+c)\}^2 + d \tag{4}$$

where a, b, c, and d are coefficients.

(iv) The magnetic detection element is a giant magnetoresistance element.

(v) Equation (5) or (6) below is used as the relationship between the magnetic flux density B and the output voltage V at the magnetic detection element.

$$V = f(B) = a\{\cos(bB+c)\} + d \tag{5}$$

where a, b, c, and d are coefficients.

$$V = f(B) = a\{\sin(bB+c)\} + d \tag{6}$$

where a, b, c, and d are coefficients.

(Points of the Invention)

According to the present invention, it is possible to provide the magnetic sensor capable of widening the range in which the linear relationship between the magnetic flux density and the output voltage is available.

BRIEF DESCRIPTION OF THE DRAWINGS

The preferred embodiments according to the invention will be explained below referring to the drawings, wherein.

DETAILED DESCRIPTION OF THE PREFERRED EMBODIMENTS

Below is described an embodiment according to the invention, in conjunction with the accompanying drawings.

Figure 1:
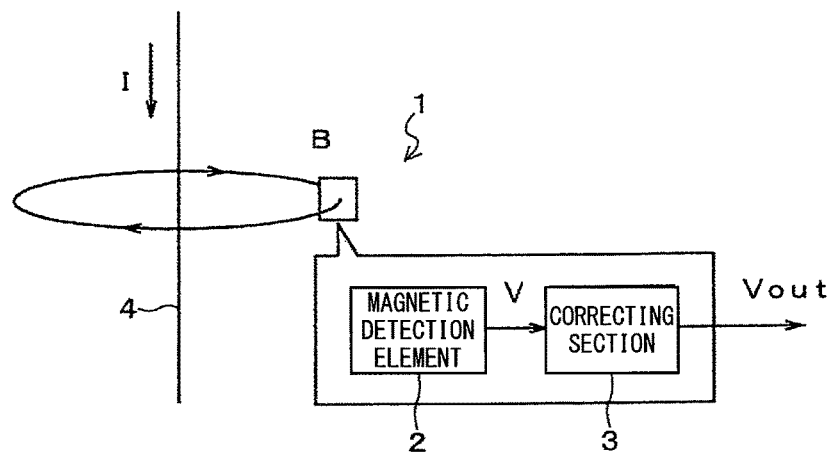
FIG. 1 is a schematic configuration diagram showing a magnetic sensor in one embodiment of the present invention.

FIG. 1 is a schematic configuration diagram showing a magnetic sensor 1 in the present embodiment.

As shown in FIG. 1, the magnetic sensor 1 includes a magnetic detection element 2, and a correcting section 3 to correct an output voltage of that magnetic detection element 2 and output the corrected output voltage.

Figure 2:
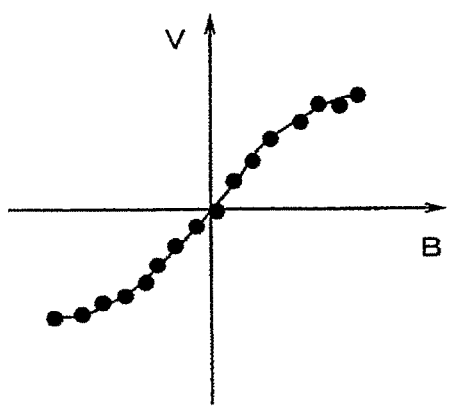
FIG. 2 is a graph showing one example of the relationship between the magnetic flux density to be detected and the output voltage before correction.

Herein, the magnetic detection element 2 uses an AMR element or a GMR element which has a nonlinear relationship between the magnetic flux density to be detected and the output voltage. In this embodiment, a case of use of the AMR element as the magnetic detection element 2 is described. The relationship between the magnetic flux density to be detected and the output voltage in the AMR element before correction is shown in FIG. 2, for example.

Now, in the magnetic sensor 1 in this embodiment, the correcting section 3 is configured to compute the magnetic flux density B from the output voltage V of the magnetic detection element 2, compute and output the corrected output voltage $V_{out}$ having a linear relationship to the computed magnetic flux density B.

More specifically, the correcting section 3 is configured to output the corrected output voltage $V_{out}$, by, when the relationship between the magnetic flux density B and the output voltage V in the magnetic detection element 2 is expressed by equation (1) below, computing the corrected output voltage $V_{out}$ from equation (2) below.

$$V = f(B) \quad (1)$$

$$V_{out} = m \cdot B = m \cdot f^{-1}(V) \quad (2)$$

where m is a coefficient, and $f^{-1}(V)$ is the inverse function of $f(B)$.

The relationship between the magnetic flux density B and the output voltage V in equation (1) can be computed, based on data obtained by repeatedly applying any magnetic flux density B to the magnetic detection element 2 beforehand, and measuring the output voltage V output from the magnetic detection element 2.

In this embodiment, since the AMR element is used as the magnetic detection element 2, equation (3) or (4) below may be used as the relationship between the magnetic flux density B and the output voltage V in the magnetic detection element 2.

$$V = f(B) = a\{\cos(bB+c)\}^2 + d \quad (3)$$

where a, b, c, and d are coefficients.

$$V = f(B) = a\{\sin(bB+c)\}^2 + d \quad (4)$$

where a, b, c, and d are coefficients. The coefficients a, b, c, and d in equations (3) and (4) may be found by a least squares method, etc.

Note that, in a case of use of the GMR element as the magnetic detection element 2, equation (5) or (6) below may be used as the relationship between the magnetic flux density B and the output voltage V in the magnetic detection element 2.

$$V = f(B) = a\{\cos(bB+c)\} + d \quad (5)$$

where a, b, c, and d are coefficients.

$$V = f(B) = a\{\sin(bB+c)\} + d \quad (6)$$

where a, b, c, and d are coefficients.

The relation expressed by equation (2) can be obtained beforehand by finding the inverse function $f^{-1}(V)$ of the function $f(B)$ expressed by any of equations (3) to (6).

Figure 3:
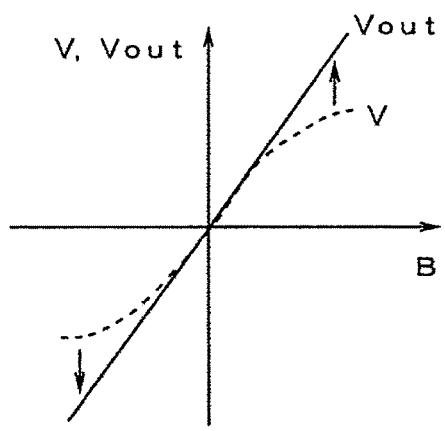
FIG. 3 is a graph showing one example of the relationship between the magnetic flux density to be detected and the corrected output voltage, in the present invention.

The correcting section 3 is configured to substitute the output voltage V of the magnetic detection element 2 into equation (2) found beforehand, thereby compute and output the corrected output voltage $V_{out}$. Here, the coefficient m in equation (2) can arbitrarily be set, and may be set appropriately according to an output voltage range required. The corrected output voltage $V_{out}$ versus magnetic flux density B relationship is expressed by a straight line with a gradient m, as shown in FIG. 3. Note that, in FIG. 3, the output voltage V of the magnetic detection element 2 is indicated by broken line.

Note that the function f(B) can be expressed by e.g. a polynomial of B, other than the above-mentioned equations (3) to (6). In this case, the inverse function $f^{-1}(V)$ of the function f(B) is also expressed by a polynomial of V.

Although herein, it is described that the correcting section 3 is provided integrally with the magnetic detection element 2 (i.e., the magnetic detection element 2 and the correcting section 3 are provided together in one chassis), the correcting section 3 may be provided separately from the magnetic detection element 2. When the correcting section 3 is provided separately from the magnetic detection element 2, the correcting section 3 is attached to a magnetic sensor which directly outputs an output voltage of a generally used magnetic detection element. It is therefore possible to achieve a wide measurement range with the simple configuration.

When electric current is detected by using the magnetic sensor 1 in the present embodiment, the magnetic sensor 1 is arranged in proximity to an electric current path 4 of the electric current to be detected, and the corrected output voltage $V_{out}$ output from the magnetic sensor 1 is detected. Thereafter, based on the corrected output voltage $V_{out}$ detected, a value I of the electric current to be detected may be found from equation (7) below.

$$I = k \cdot B = k \cdot V_{out}/m \quad (7)$$

where k is a coefficient. Note that the coefficient k in equation (7) is determined by distance from the electric current path 4 to the magnetic sensor 1 (the magnetic detection element 2), temperature, etc.

As described above, the magnetic sensor 1 in the present embodiment includes the magnetic detection element 2, and the correcting section 3 to correct and output the output voltage V of that magnetic detection element 2, and the correcting section 3 is configured to compute the magnetic flux density B from the output voltage V of the magnetic detection element 2, compute and output the corrected output voltage $V_{out}$ having a linear relationship to the computed magnetic flux density B.

This configuration of the correcting section 3 makes it possible to greatly widen the range in which the linear relationship between the magnetic flux density B and the output voltage (the corrected output voltage $V_{out}$) is available, in comparison with the conventional art. In other words, it is possible to provide the linear output voltage in the wide range of electric current to be measured, even without using complicated measuring methods. It is therefore possible to widen the range of electric current values to be detected, and it is also possible to enhance the degree of freedom of arrangement of the magnetic sensor 1.

The invention is not limited to the above embodiments, but various alterations may naturally be made without departing from the spirit and scope of the invention.

Although the invention has been described with respect to the specific embodiments for complete and clear disclosure, the appended claims are not to be thus limited but are to be construed as embodying all modifications and alternative constructions that may occur to one skilled in the art which fairly fall within the basic teaching herein set forth.

What is claimed is:

1. A magnetic sensor, comprising:
a single magnetic detection element that detects an electric current conducted through a single current path by outputting a voltage that is dependent upon a magnetic flux density generated by the electric current, wherein the relationship between the output voltage and the magnetic flux density is nonlinear; and
a correcting section that corrects the output voltage of the magnetic detection element such that the relationship between the output voltage and the magnetic flux density is linear and outputs the corrected output voltage,
wherein the correcting section is configured to compute a magnetic flux density from the corrected output voltage of the magnetic detection element, and to compute and output a value of the electric current that generated the magnetic flux density.

2. The magnetic sensor according to claim 1, wherein the correcting section is configured to output a corrected output voltage $V_{out}$, by, when a relationship between a magnetic flux density B and an output voltage V at the magnetic detection element is expressed by equation (1) below, computing the corrected output voltage $V_{out}$ from equation (2) below:

$$V = f(B) \tag{1}$$

$$V_{out} = m \cdot B = m \cdot f^{-1}(V) \tag{2}$$

where m is a coefficient, and $f^{-1}(V)$ is the inverse function of $f(B)$.

3. The magnetic sensor according to claim 2, wherein the magnetic detection element is an anisotropic magnetoresistance element.

4. The magnetic sensor according to claim 3, wherein equation (3) or (4) below is used as the relationship between the magnetic flux density B and the output voltage V at the magnetic detection element:

$$V = f(B) = a\{\cos(bB+c)\}^2 + d \tag{3}$$

where a, b, c, and d are coefficients;

$$V = f(B) = a\{\sin(bB+c)\}^2 + d \tag{4}$$

where a, b, c, and d are coefficients.

5. The magnetic sensor according to claim 2, wherein the magnetic detection element is a giant magnetoresistance element.

6. The magnetic sensor according to claim 5, wherein equation (5) or (6) below is used as the relationship between the magnetic flux density B and the output voltage V at the magnetic detection element:

$$V = f(B) = a\{\cos(bB+c)\} + d \tag{5}$$

where a, b, c, and d are coefficients;

$$V = f(B) = a\{\sin(bB+c)\} + d \tag{6}$$

where a, b, c, and d are coefficients.

7. A magnetic sensor, comprising:
a single magnetic detection element that detects an electric current conducted through a single current path by outputting a voltage that is dependent upon a magnetic flux density generated by the electric current, wherein the relationship between the output voltage and the magnetic flux density is nonlinear; and
a correcting section that corrects the output voltage of the magnetic detection element such that the relationship between the output voltage and the magnetic flux density is linear and outputs the corrected output voltage,
wherein the correcting section is configured to compute a magnetic flux density from the corrected output voltage of the magnetic detection element, and to compute and output a value of the electric current that generated the magnetic flux density,
wherein the single magnetic detection element is one of an anisotropic magnetoresistance element and a giant magnetoresistance element.

8. The magnetic sensor according to claim 7, wherein the correcting section is configured to output a corrected output voltage $V_{out}$, by, when a relationship between a magnetic flux density B and an output voltage V at the magnetic detection element is expressed by equation (1) below, computing the corrected output voltage $V_{out}$ from equation (2) below:

$$V = f(B) \tag{1}$$

$$V_{out} = m \cdot B = m \cdot f^{-1}(V) \tag{2}$$

where m is a coefficient, and $f^{-1}(V)$ is the inverse function of $f(B)$.

9. The magnetic sensor according to claim 8, wherein equation (3) or (4) below is used as the relationship between the magnetic flux density B and the output voltage V at the magnetic detection element:

$$V = f(B) = a\{\cos(bB+c)\}^2 + d \tag{3}$$

where a, b, c, and d are coefficients;

$$V = f(B) = a\{\sin(bB+c)\}^2 + d \tag{4}$$

where a, b, c, and d are coefficients.

10. The magnetic sensor according to claim 9, wherein equation (5) or (6) below is used as the relationship between the magnetic flux density B and the output voltage V at the magnetic detection element:

$$V = f(B) = a\{\cos(bB+c)\} + d \tag{5}$$

where a, b, c, and d are coefficients;

$$V = f(B) = a\{\sin(bB+c)\} + d \tag{6}$$

where a, b, c, and d are coefficients.

* * * * *